(12) United States Patent
Nuessle

(10) Patent No.: US 6,844,746 B2
(45) Date of Patent: Jan. 18, 2005

(54) ELECTRICAL SYSTEM LIKE A TESTING SYSTEM FOR TESTING THE CHANNELS OF A COMMUNICATION SYSTEM

(75) Inventor: Heinz Nuessle, Rottenburg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 89 days.

(21) Appl. No.: 10/305,233

(22) Filed: Nov. 26, 2002

(65) Prior Publication Data

US 2003/0189841 A1 Oct. 9, 2003

(30) Foreign Application Priority Data

Apr. 6, 2002 (EP) .............................................. 02007781

(51) Int. Cl.[7] .......................... G01R 27/08; G01R 01/00
(52) U.S. Cl. ...................... 324/713; 324/537; 324/73.1; 324/158.1
(58) Field of Search ................................ 324/520, 522, 324/525, 537, 713, 76.11, 73.1, 158.1; 323/311; 327/331, 540

(56) References Cited

U.S. PATENT DOCUMENTS 6,157,247 A * 12/2000 Abdesselem et al. ....... 327/540
6,580,623 B1 * 6/2003 Williams et al. .............. 363/78

FOREIGN PATENT DOCUMENTS

EP        0212045 A2    3/1987

OTHER PUBLICATIONS

Patent Abstracts of Japan document No. JP 2002014139.
Patent Abstracts of Japan document No. JP 05251519.
Patent Abstracts of Japan document No. JP 11155233.

* cited by examiner

Primary Examiner—Vincent Q. Nguyen

(57) ABSTRACT

An electrical system includes at least one function board and at least one voltage converter. The function board and the voltage converter are connected such that a voltage generated by the voltage converter is supplied to the function board. The electrical system includes an electrical circuit for evaluating the voltage required by the function board and for controlling the voltage converter depending on the evaluated voltage.

7 Claims, 2 Drawing Sheets

ELECTRICAL SYSTEM LIKE A TESTING SYSTEM FOR TESTING THE CHANNELS OF A COMMUNICATION SYSTEM

BACKGROUND OF THE INVENTION

1. Field of the Invention

The invention relates to an electrical system like a testing system for testing the channels of a communication system.

2. Brief Description of Related Developments

Such electrical system comprises at least one function board and at least one voltage converter, wherein the function board and the voltage converter are connected such that a voltage generated by the voltage converter is supplied to the function board. In an electrical testing system, the one or more function boards may be realized by so-called channel boards wherein different channel boards may require different supply voltages.

For that purpose, different voltage converters are provided on the power supply board, however, the more voltages being required, the more voltage converters being necessary.

SUMMARY OF THE INVENTION

It is therefore an object of the invention to provide an electrical system as described above with the ability to provide a number of different voltages without requiring additional voltage converters.

This object is solved by an electrical system having at least one function board and at least one voltage converter, wherein the function board and the voltage converter are connected such that a voltage generated by the voltage converter is supplied to the function board. The electrical system includes an electrical circuit for evaluating the voltage required by the function board and for controlling the voltage converter depending on the evaluated voltage.

In particular, the electrical system comprises an electrical circuit for evaluating the voltage required by the function board and for controlling the voltage converter depending on the evaluated voltage.

As a result, the voltage generated by the voltage converter may be changed depending on the evaluated voltage required by the function board. It is therefore not necessary anymore to provide as much voltage converters as voltages are required but it is possible to adapt the available voltage converters to those voltages required by the function board. The number of voltage converters is thereby reduced.

In an advantageous embodiment of the invention, the electrical system comprises a resistor on the function board wherein the value of the resistor unambiguously defines the value of the voltage required by the function board. Consequently, each possible function board may be provided with a resistor such that it is supplied with its required voltage. The value of the resistor is detected and the voltage of the voltage converter is controlled depending on this value of the resistor.

It is advantageous if the electrical system comprises a power control circuit for generating a control signal forwarded to the voltage converter wherein the required voltage is used by the power control circuit as a reference voltage. Furthermore, the required voltage may be forwarded to the voltage converter to be added as an offset voltage to a control signal generated by the power control circuit.

BRIEF DESCRIPTION OF THE DRAWINGS

The invention together with further objects, advantages, features and aspects thereof will be more clearly understood from the following description taken in connection with the accompanying drawings.

DETAILED DESCRIPTION OF THE PREFERRED EMBODIMENT(S)

Figure 1:
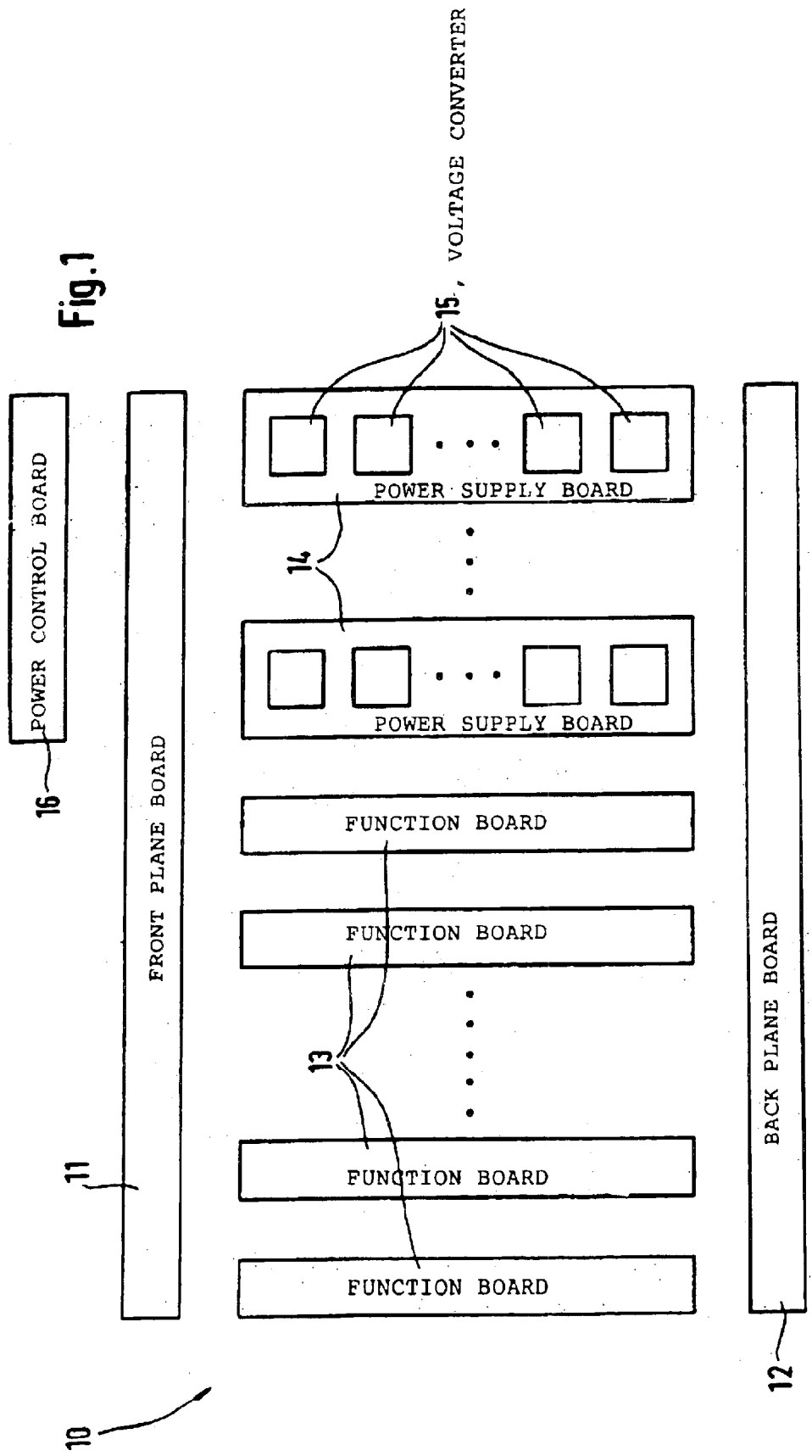
FIG. 1 is a schematic block diagram of an electrical system comprising at least one function board and at least one power supply board.

In FIG. 1, an electrical system 10 is shown, for example an electrical testing system for testing the channels of a communication system. The electrical system 10 is comprised in a rack or the like which provides a front plane board 11 and a back plane board 12. In between the front plane board 11 and the back plane board 12, a number of boards may be plugged into the rack.

As shown in FIG. 1, the electrical system 10 is provided with a number of function boards 13 and a number of power supply boards 14. The function boards 13 may e.g. comprise the electrical circuits for testing the channels of the communication system. As an example, eight function boards, referred to as channel boards may be present within the electrical system 10. The power supply boards 14 comprise the electrical circuits for creating the required voltages for the function boards. As an example, four such power supply boards 14 may be present within the electrical system 10.

Each one of the power supply boards 14 comprises a number of voltage converters 15 wherein each one of these voltage converters 15 is used to create one of the required voltages. As an example, five voltage converters 15 are present within each one of the power supply boards 14.

The front plane board 11 and the back plane board 12 comprise the connections between the function boards 13 and the power supply boards 14. As well, the front plane board 11 and the back plane board 12 provide grounds for the electrical circuits on the function boards 13 and the power supply boards 14, i.e. a front plane ground and a back plane ground.

Furthermore, a power control board 16 is connected to the front plane board 11 which comprises electrical circuits in particular for controlling the voltages created on the power supply boards 14.

Figure 2:
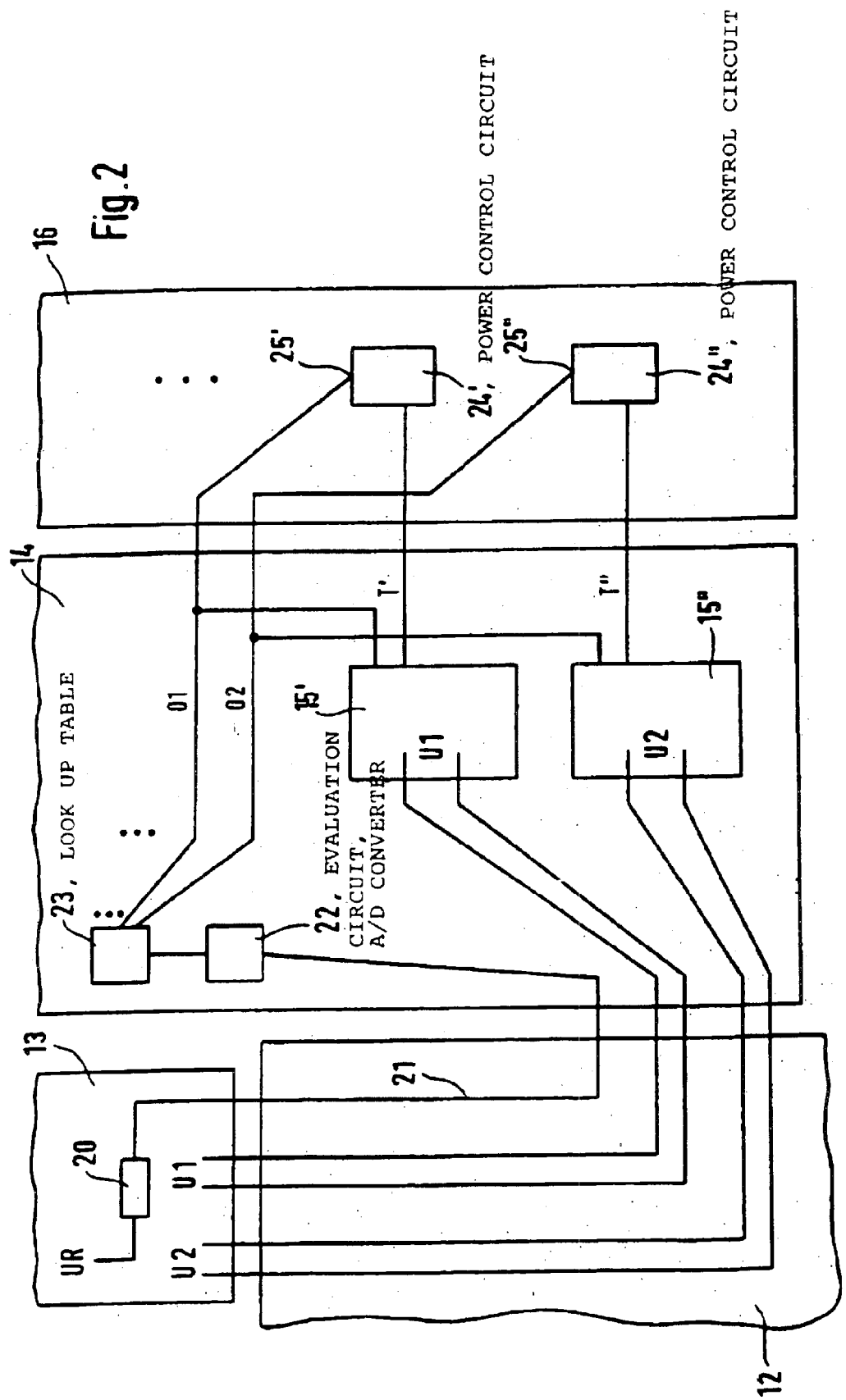
FIG. 2 is a more detailed schematic block diagram of the two function boards and the power supply board of FIG. 1.

In FIG. 2, one of the function boards 13, the back plane board 12, one of the power supply boards 14 with two voltage converters 15', 15" and the power control board 16 are shown.

The voltage converter 15' creates a first voltage U1 and the voltage converter 15" creates a second voltage U2. The two voltages U1, U2 may be different or equal.

These two voltages U1, U2 are provided to the function board 13. The electrical connections between the voltage converters 15', 15" and the function board 13 are carried out via the back plane board 12.

In particular in an electrical testing system, it is often required that the function board 13 must be supplied with a specific voltage by one of the voltage converters 15', 15". As a consequence, if another function board 13 is plugged in the electric system 10, it may be necessary to change the voltage supplied to the plugged in function board 13.

In order to carry out such a change of the voltage, if required, the electrical system 10 of FIG. 1 comprises features as described below in connection with FIG. 2.

As shown in FIG. 2, the function board 13 is provided with a resistor 20. The resistors 20 is supplied with a voltage UR, e.g. −12 V which may be taken e.g. from the back plane board 12.

The resistor 20 identifies the required voltage of the function board 13. This means that a specific function board is provided with a specific value of its resistor wherein the specific value of the resistor unambiguously identifies the voltage required by the function board.

As shown in FIG. 2, the resistor 20 is connected to the power supply board 14 via the back plane board 12. The respective connection is characterized by the reference numeral 21.

On the power supply board 14, the connection 21 is connected to an evaluation circuit 22 which is then connected to a lookup table 23.

The evaluation circuit 22 evaluates the value of the resistor 20. This may be carried out with the help of one or more comparators. The evaluation circuit 22 then converts the resulting value of the resistor 20 into a digital value and forwards this digital value to the lookup table 23.

The lookup table 23 comprises a list of all possible resistors 20 with all corresponding voltages. The lookup table 23, therefore, comprises an entry for every function board wherein this entry includes the value of the resistor being used on the respective function board and the corresponding voltage required by this function board.

As shown in FIG. 2, it is possible that one and the same function board 13 requires two different voltages U1, U2. In this case, the list of the lookup table 23 not only includes one required voltage for one and the same function board, but two or even a more required voltages.

As shown in FIG. 2, the lookup table 23 generates one or more output signals O1, O2. The number of the output signals depends on the number of voltages required by the respective function board 13. Any one of the output signals O1, O2 of the lookup table 23 corresponds to one of these required voltages. The output signals O1, O2 are converted into analogue values within the lookup table 23.

The output signals O1, O2 are forwarded to the power control board 16, if necessary via the front panel board 11 (not shown in FIG. 2).

The power control board 16 comprises a number of power control circuits 24', 24". Any one of the power control circuits 24', 24" is dedicated to one of the voltage converters 15', 15" of the power supply board 14. Any one of the power control circuits 24', 24" is used to control the voltage generated by the corresponding voltage converter 15', 15". For that purpose, the power control circuits 24', 24" are provided with an input 25', 25" for receiving a reference voltage. The power control circuit 24', 24" then regulates the voltage provided by the corresponding voltage converter 15', 15" to the corresponding reference voltage.

As shown in FIG. 2, the power control circuit 24' receives the output signal O1 of the lookup table 23 at its input 25'. Therefore, the power control circuit 24' regulates the voltage U1 generated by the voltage converter 15' to correspond to the reference voltage defined by the output signal O1. For that purpose, the power control circuit 24' forwards a control signal T' to the voltage converter 15'. A similar control is carried out by the power control circuit 24".

Hence, the voltage U1 generated by the voltage converter 15' is adjusted according to the output signal O1 and the voltage U2 generated by the voltage converter 15" is adjusted according to the output signal O2. As the output signals O1, O2 depend, as described, on the value of the resistor 20, the voltages U1, U2 are also depending on the resistor 20.

As a result, the voltages U1, U2 supplied to the function board 13 depend on the resistor 20 being present on this function card 13. Different function boards with different resistors may therefore be supplied with different voltages, however, using the same voltage converters 15', 15" and the same power control circuits 24', 24".

Furthermore, the output signals O1, O2 of the lookup table 23 are forwarded directly to the voltage converters 15', 15" of the power supply board 14. There, the output signals O1, O2 may be added as offset values to the control signals T', T" provided by the power control circuits 24', 24", respectively.

It is also possible that the lookup table 23 comprises an entry for a specific value of a resistor that the corresponding function board may not be used. In this case, the corresponding voltage converters 15, 15' are disabled.

It shall be mentioned that the above described electrical system 10 may also comprise only a single voltage converter so that only a single voltage is provided to the function board. In this case, the output signal of the decision circuit 24 is only connected to this single voltage converter.

What is claimed is:

1. An electrical system comprising at least one function board and at least one voltage converter, wherein the function board and the voltage converter are connected such that a voltage generated by the voltage converter is supplied to the function board, and comprising an electrical circuit for evaluating the voltage required by the function board and for controlling the voltage converter depending on the evaluated voltage.

2. The electrical system of claim 1 comprising a resistor on the function board wherein the value of the resistor unambiguously defines the value of the voltage required by the function board.

3. The electrical system of claim 2 comprising an evaluation circuit for evaluating the value of the resistor.

4. The electrical system of claim 2 comprising a lookup table with a list including the value of the resistor and the corresponding required voltage.

5. The electrical system of claim 4 comprising a power control circuit for generating a control signal forwarded to the voltage converter wherein the required voltage taken from the lookup table is used by the power control circuit as a reference voltage.

6. The electrical system of claim 4 wherein the required voltage is forwarded to the voltage converter to be added as an offset voltage to a control signal generated by the power control circuit.

7. The electrical system of claim 1 wherein the function board is a so-called channel board for testing the channels of a communication system.

* * * * *